(12) United States Patent
Aoki

(10) Patent No.: US 10,720,485 B2
(45) Date of Patent: Jul. 21, 2020

(54) DISPLAY DEVICE HAVING A REDUCED RISK OF DISCONNECTION OF A WIRING LINE INCLUDED IN A CURVED REGION

(71) Applicant: Japan Display Inc., Minato-ku (JP)

(72) Inventor: Hayata Aoki, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 13 days.

(21) Appl. No.: 15/975,898

(22) Filed: May 10, 2018

(65) Prior Publication Data

US 2018/0337224 A1 Nov. 22, 2018

(30) Foreign Application Priority Data

May 16, 2017 (JP) .................. 2017-097021

(51) Int. Cl.
*H01L 29/10* (2006.01)
*H01L 27/32* (2006.01)
*H01L 51/56* (2006.01)
*G09G 3/3233* (2016.01)
*G09G 3/3266* (2016.01)
*G09G 3/3225* (2016.01)
*H01L 51/52* (2006.01)

(52) U.S. Cl.
CPC ....... *H01L 27/3276* (2013.01); *G09G 3/3225* (2013.01); *G09G 3/3233* (2013.01); *G09G 3/3266* (2013.01); *H01L 27/3262* (2013.01); *H01L 27/3265* (2013.01); *H01L 51/5253* (2013.01); *H01L 51/5281* (2013.01); *H01L 51/56* (2013.01); *G09G 2300/0426* (2013.01); *G09G 2380/02* (2013.01); *H01L 2251/5338* (2013.01)

(58) Field of Classification Search
USPC .......................................... 257/40
See application file for complete search history.

(56) References Cited

U.S. PATENT DOCUMENTS

| 9,276,055 B1* | 3/2016 | Son | H01L 27/3288 |
| 9,287,329 B1* | 3/2016 | Lee | H01L 51/0097 |
| 9,318,398 B2* | 4/2016 | Lee | H01L 22/34 |
| 9,425,418 B2* | 8/2016 | Kwon | H01L 27/3276 |
| 9,713,256 B2* | 7/2017 | Jeon | G02F 1/13452 |
| 10,388,713 B2* | 8/2019 | Son | H01L 27/323 |

(Continued)

*Primary Examiner* — Caleb E Henry
(74) *Attorney, Agent, or Firm* — Oblon, McClelland, Maier & Neustadt, L.L.P.

(57) ABSTRACT

A display device according to an embodiment of the present invention includes: a display panel including a display region, a drive section forming region, and a curved region, the display region including a pixel array section, the drive section forming region including a drive section driving the pixel array section, the curved region coupling the display region to the drive section forming region, the display panel including an organic light-emitting diode structure layer including an organic light-emitting diode, an optical film provided on a front surface side of the organic light-emitting diode structure layer in the display region and including an inclined surface at an end face on the curved region side, and a resin layer provided on the front surface side of the organic light-emitting diode structure layer in at least the curved region and provided so as to be in contact with the inclined surface.

7 Claims, 8 Drawing Sheets

(56) References Cited

U.S. PATENT DOCUMENTS

| | | | |
|---|---|---|---|
| 2015/0212548 A1* | 7/2015 | Namkung | G06F 1/1652 |
| | | | 345/174 |
| 2015/0249231 A1* | 9/2015 | Yaginuma | H01L 51/5281 |
| | | | 257/40 |
| 2016/0011459 A1* | 1/2016 | Li | G02F 1/133528 |
| | | | 349/33 |
| 2016/0172428 A1 | 6/2016 | Song et al. | |
| 2016/0190522 A1* | 6/2016 | Lee | H01L 51/0097 |
| | | | 257/40 |
| 2016/0275830 A1* | 9/2016 | You | G06F 3/041 |
| 2017/0330925 A1* | 11/2017 | Tang | H01L 27/3267 |

\* cited by examiner

DISPLAY DEVICE HAVING A REDUCED RISK OF DISCONNECTION OF A WIRING LINE INCLUDED IN A CURVED REGION

CROSS-REFERENCE TO RELATED APPLICATION

The present application claims priority from Japanese application JP2017-97021 filed on May 16, 2017, the content of which is hereby incorporated by reference into this application.

BACKGROUND OF THE INVENTION

1. Field of the Invention

The present invention relates to a display device and a manufacturing method of a display device.

2. Description of the Related Art

A flat panel display such as an organic electroluminescent (EL) display device includes a display panel in which a thin film transistor (TFT), an organic light-emitting diode (OLED), and the like are formed on a substrate. A glass substrate has been conventionally used for a base material of the display panel. In recent years, however, a flexible display in which the display panel can be bent is being developed with use of a resin film or the like such as a polyimide film for the base material.

As applications of the flexible display, it is considered to achieve a narrower picture-frame by folding a mounting section of an integrated circuit (IC) or a flexible printed circuit (FPC), which is provided outside an image display region of the display panel, to the rear side of the display region.

U.S. Patent Application Publication No. 2016/0172428 discloses a configuration in which a micro-coating layer made of a photo-curable acrylic resin is provided on the outer surface side of a curved region formed by folding the mounting section to the rear surface side of the display region.

SUMMARY OF THE INVENTION

In the conventional configuration, however, there is room for a further reduction in the occurrence risk of disconnection of wiring lines included in the display panel. That is, in the conventional configuration, the micro-coating layer may ride up over a polarization layer provided in the display region due to a surface tension or the like (see FIG. 8). Therefore, neutral plane control in an interface region between the polarization layer and the micro-coating layer is not in a proper state, and thus a wiring line present in the interface region is present in a position deviated from the neutral plane. As a result, the wiring line is subjected to a compressive stress, which may result in disconnection.

The invention has been made in view of the problem described above, and it is an object of the invention to achieve a further reduction in the occurrence risk of disconnection of a wiring line included in a display panel.

(1) A display device according to an embodiment of the present invention includes: a display panel including a display region, a drive section forming region, and a curved region, the display region including a pixel array section, the drive section forming region including a drive section driving the pixel array section, the curved region coupling the display region to the drive section forming region, the display panel including an organic light-emitting diode structure layer including an organic light-emitting diode, an optical film provided on a front surface side of the organic light-emitting diode structure layer in the display region and including an inclined surface at an end face on the curved region side, and a resin layer provided on the front surface side of the organic light-emitting diode structure layer in at least the curved region and provided so as to be in contact with the inclined surface.

(2) In the display device as described in (1) above, the curved region is curved, so that a rear surface side of the display region and a rear surface side of the drive section forming region face each other.

(3) In the display device as described in (1) above, in a forming region of the inclined surface, the thickness of the optical film is reduced with decreasing distance from the display region side toward the curved region side.

(4) In the display device as described in (1) above, an end of the resin layer is disposed at some midpoint of the inclined surface.

(5) In the display device as described in (2) above, the organic light-emitting diode structure layer includes a wiring layer, and in the curved region, the wiring layer is disposed in a neutral plane where a tensile stress and a compressive stress that occur in a configuration including the resin layer and the organic light-emitting diode structure layer are canceled out.

(6) In the display device as described in (1) above, the resin layer includes a curable resin composition.

(7) In the display device as described in (1) above, the optical film is made of a material whose influence on the phase of light emitted from the organic light-emitting diode is smaller than that of the resin layer.

(8) In the display device as described in (7) above, the optical film includes a cycloolefin-based resin material.

(9) A manufacturing method of a display device according to an embodiment of the present invention includes: a display panel including a display region, a drive section forming region, and a curved region, the display region including a pixel array section, the drive section forming region including a drive section driving the pixel array section, the curved region coupling the display region to the drive section forming region, forming an organic light-emitting diode structure layer including an organic light-emitting diode; disposing, on a front surface side of the organic light-emitting diode structure layer in the display region, an optical film including an inclined surface at an end face on the curved region side; and forming, on the front surface side of the organic light-emitting diode structure layer in at least the curved region, a resin layer in contact with the inclined surface.

(10) In the manufacturing method of the display device as described in (9) above, in the forming of the resin layer, the resin layer is applied by an inkjet method to the front surface side of the organic light-emitting diode structure layer in the curved region.

(11) In the manufacturing method of the display device as described in (9) above, in the forming of the resin layer, the resin layer is formed such that an end of the resin layer is disposed at some midpoint of the inclined surface.

(12) In the manufacturing method of the display device as described in (9) above, the organic light-emitting diode structure layer includes a wiring layer, and in the forming of the resin layer, the thickness of the resin layer is controlled such that the wiring layer is disposed in a neutral plane in the curved region.

DETAILED DESCRIPTION OF THE INVENTION

Figure 1:
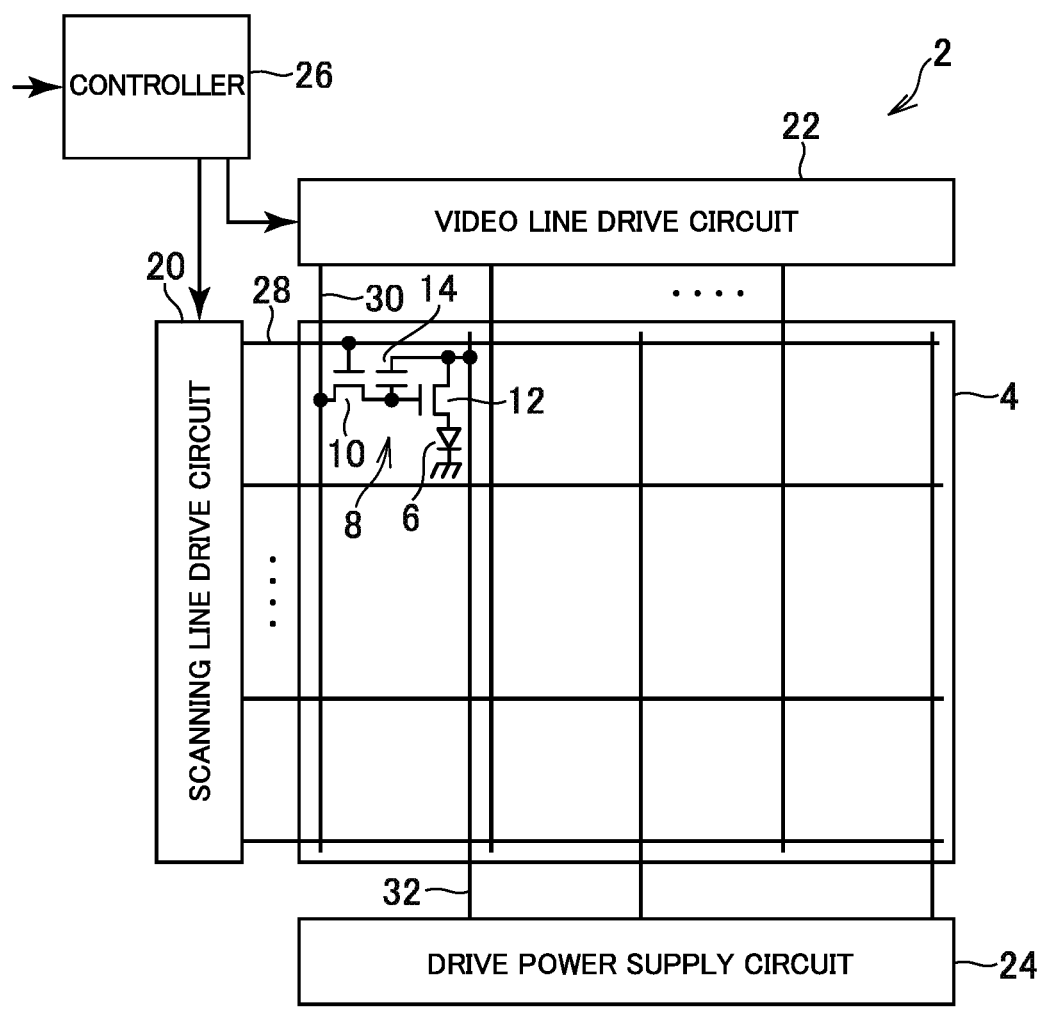
FIG. 1 is a schematic view showing a schematic configuration of a display device according to an embodiment.

Hereinafter, embodiments of the invention will be described based on the drawings.

The disclosed embodiments are merely examples, and appropriate variations within the spirit of the present invention that can be easily arrived at by those skilled in the art are naturally included in the scope of the present invention. Further, while the width, thickness, shape, and the like of each part in the drawings may be illustrated schematically as compared with actual embodiments in order to clarify the explanation, these are merely examples and an interpretation of the present invention should not be limited thereto. Furthermore, in the specification and respective drawings, the same reference symbols may be applied to elements similar to those that have already been illustrated in another drawing and a detailed explanation of such elements may be omitted as appropriate. Further, unless otherwise noted, embodiments of the invention can be combined with each other.

A display device 2 according to an embodiment is, for example, an organic electroluminescent display device, and is mounted in a television set, a personal computer, a portable terminal, a mobile phone, and the like. FIG. 1 is a schematic view showing a schematic configuration of the display device 2 according to the embodiment. The display device 2 includes a pixel array section 4 that displays an image, and a drive section that drives the pixel array section 4. The display device 2 may include a base material made of glass or the like. The display device 2 may be a flexible display having flexibility, in which case the display device 2 may include a base material made of a resin film or the like having flexibility. The display device 2 includes a wiring layer including wiring lines provided within or above the base material.

In the pixel array section 4, organic light-emitting diodes 6 and pixel circuits 8 are disposed in a matrix so as to correspond to pixels. The pixel circuit 8 includes a lighting thin film transistor (TFT) 10, a drive TFT 12, and a capacitor 14, etc.

On the other hand, the drive section includes a scanning line drive circuit 20, a video line drive circuit 22, a drive power supply circuit 24, and a controller 26. The drive section drives the pixel circuit 8 and controls emission of the organic light-emitting diode 6.

The scanning line drive circuit 20 is connected to scanning signal lines 28 each provided for an array of pixels in the horizontal direction (a pixel row). The scanning line drive circuit 20 sequentially selects the scanning signal line 28 in response to a timing signal input from the controller 26, and applies a voltage for turning on the lighting TFT 10 to the selected scanning signal line 28.

The video line drive circuit 22 is connected to video signal lines 30 each provided for an array of pixels in the vertical direction (a pixel column). The video line drive circuit 22 receives a video signal from the controller 26, and outputs, in synchronization with the selection of the scanning signal line 28 by the scanning line drive circuit 20, a voltage in response to the video signal of the selected pixel row to each of the video signal lines 30. The voltage is written to the capacitor 14 via the lighting TFT 10 in the selected pixel row. The drive TFT 12 supplies an electric current in response to the written voltage to the organic light-emitting diode 6, and thus the organic light-emitting diode 6 of the pixel corresponding to the selected scanning signal line 28 emits light.

The drive power supply circuit 24 is connected to drive power supply lines 32 each provided for the pixel column, and supplies a current to the organic light-emitting diode 6 via the drive power supply line 32 and the drive TFT 12 in the selected pixel row.

Here, a lower electrode of the organic light-emitting diode 6 is connected to the drive TFT 12. On the other hand, upper electrodes of the organic light-emitting diodes 6 are composed of an electrode common to the organic light-emitting diodes 6 of all pixels. When the lower electrode is configured as an anode, a high potential is input thereto and a low potential is input to the upper electrode that serves as a cathode. When the lower electrode is configured as a cathode, a low potential is input thereto and a high potential is input to the upper electrode that serves as an anode.

Figure 2:
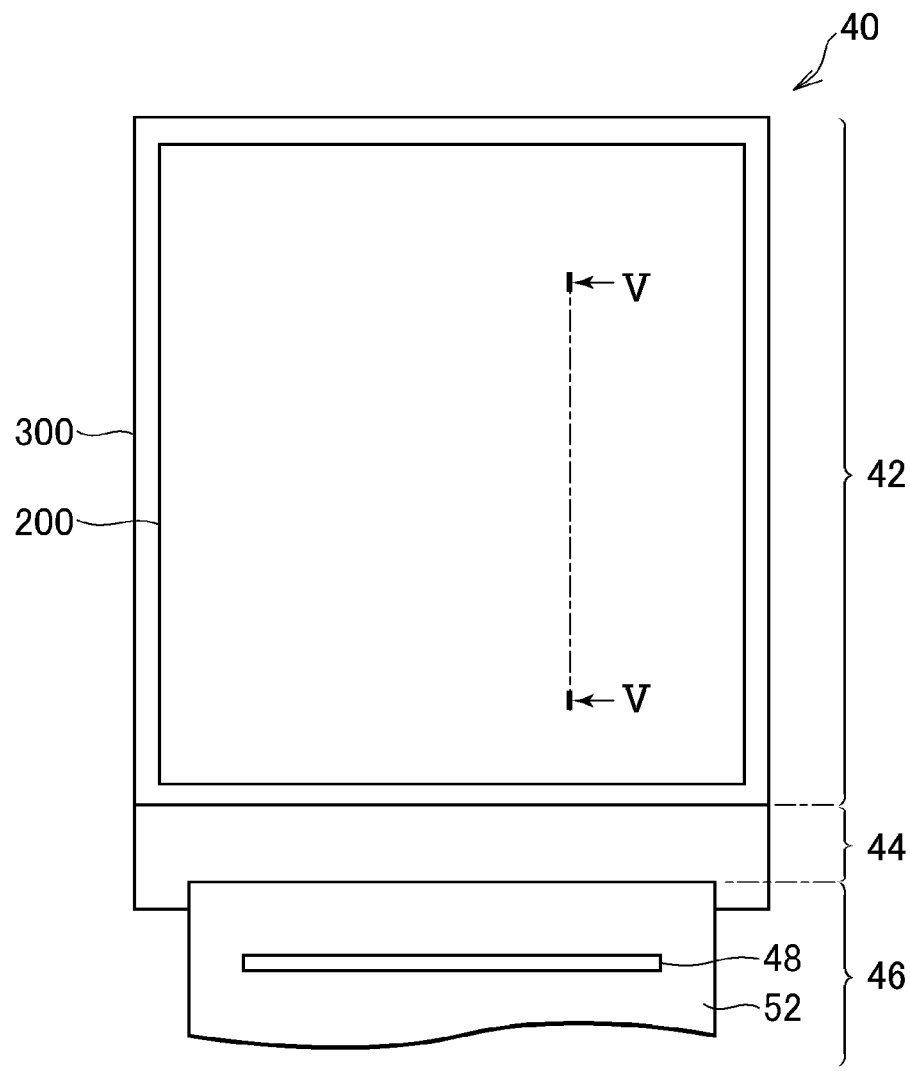
FIG. 2 is a schematic plan view of a display panel in the display device according to the embodiment.
Figure 3:
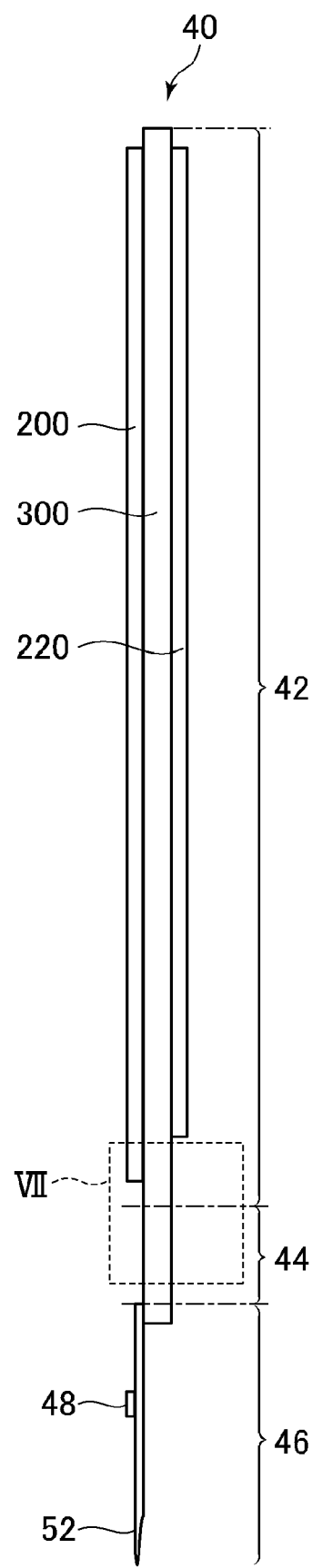
FIG. 3 is a schematic side view of the display panel in the display device according to the embodiment.

FIG. 2 is a schematic plan view of a display panel 40 in the embodiment. FIG. 3 is a schematic side view of the display panel 40 in the embodiment. The display panel 40 includes an organic light-emitting diode structure layer 300 including the organic light-emitting diodes 6 provided in the pixel array section 4.

As shown in FIG. 2, in a display region 42 of the display panel 40, a polarizer 200 is disposed on the front surface side of the organic light-emitting diode structure layer 300. Moreover, as shown in FIG. 3, a protective film 220 is disposed on the rear surface side of the organic light-emitting diode structure layer 300.

A drive section forming region 46 is provided outside the display region 42 of the display panel 40. In the drive section forming region 46 in the embodiment, a flexible printed circuit (FPC) 52 is connected to the organic light-emitting diode structure layer 300, and a driver IC 48 constituting the drive section described above is mounted on the FPC 52. The FPC 52 is connected to the scanning line drive circuit 20, the video line drive circuit 22, the drive power supply circuit 24, the controller 26, and the like, or an IC is mounted on the FPC 52.

Figure 5:
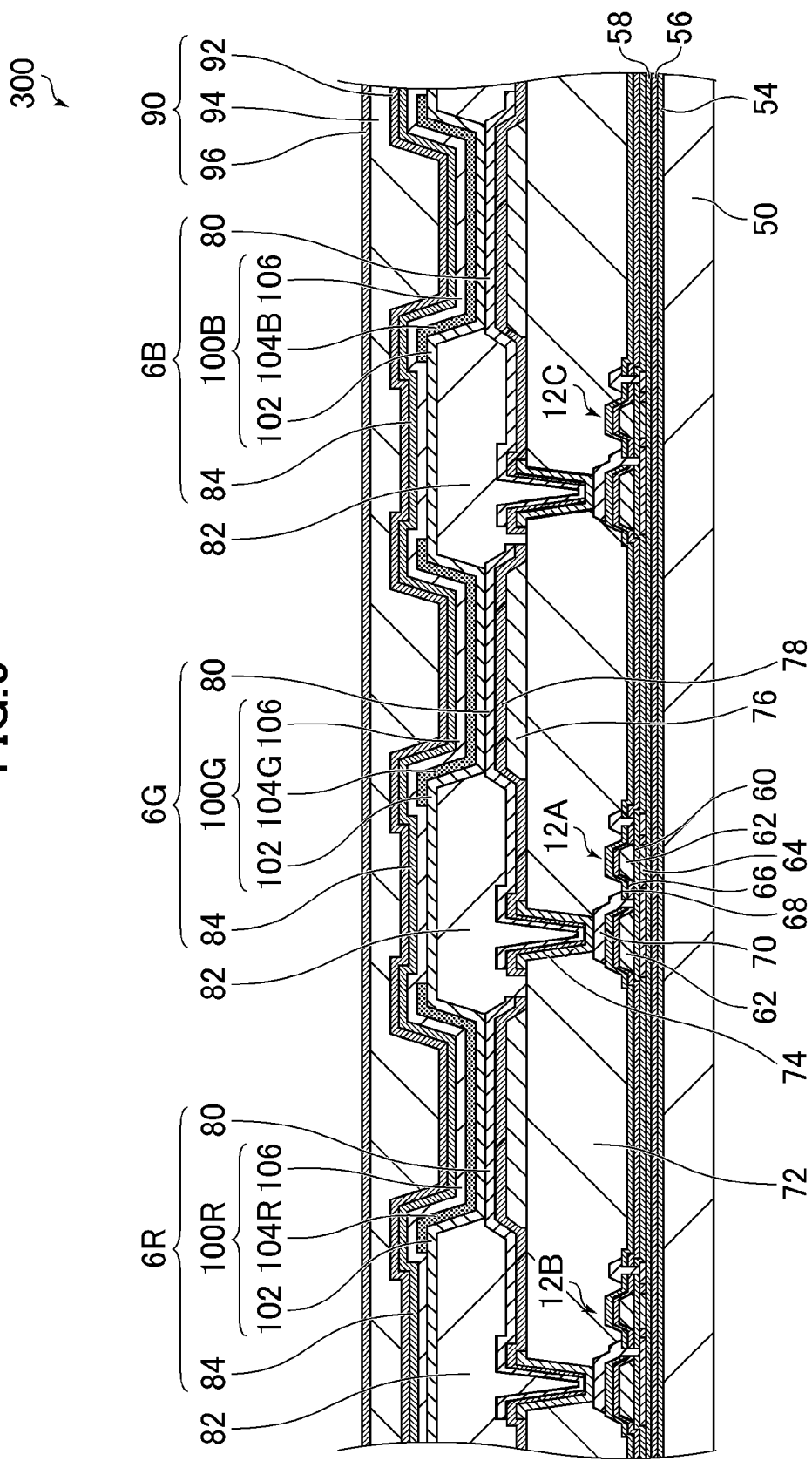
FIG. 5 is a schematic vertical sectional view of the display panel at a position along the line V-V shown in FIG. 2.

FIG. 5 is a schematic vertical sectional view of the organic light-emitting diode structure layer 300 at a position along the line V-V shown in FIG. 2. As shown in FIG. 5, the organic light-emitting diode structure layer 300 of the embodiment includes an array substrate 50. In the embodiment, polyimide is used as a material constituting the array substrate 50. However, other resin material may be used as a material constituting the array substrate 50 as long as a base material has sufficient flexibility as a sheet display.

A three-layer stacked structure including a first silicon oxide film 54, a first silicon nitride film 56, and a second silicon oxide film 58 is provided as an undercoat layer above the array substrate 50. The first silicon oxide film 54 in the lowermost layer is provided for improvement in adhesion with the array substrate 50. The first silicon nitride film 56 in the middle layer is provided as a block film for moisture and impurities from the outside. The second silicon oxide film 58 in the uppermost layer is provided as a block film to prevent hydrogen atoms contained in the first silicon nitride film 56 from diffusing to the semiconductor layer side. The undercoat layer is not particularly limited to this structure. The undercoat layer may have a structure including a further stacked layer, or may have a single-layer structure or a two-layer structure.

A first drive TFT 12A, a second drive TFT 12B, and a third drive TFT 12C are provided above the undercoat layer. Each of the drive TFTs 12 has a structure in which a low-concentration impurity region is provided between a channel region and a source-drain region. In the embodiment, a silicon oxide film is used as a gate insulating film 60, and a first wiring line 62 formed of a stacked structure of Ti and Al is used as a gate electrode. The first wiring line 62 functions as a storage capacitance line in addition to its function as the gate electrode of the drive TFT 12. That is, the first wiring line 62 is used to form a storage capacitance between a polysilicon film 64 and the first wiring line 62.

Above the drive TFT 12, a second silicon nitride film 66 serving as an interlayer insulating film and a third silicon oxide film 68 are stacked, and further, a second wiring line 70 serving as a source-drain electrode and a routing wiring line is formed. In the embodiment, the second wiring line 70 is configured to have a three-layer stacked structure of Ti, Al, and Ti. A storage capacitance is formed by an electrode formed of a conductive layer in the same layer as the interlayer insulating film and the first wiring line 62, and an electrode formed of a conductive layer in the same layer as a source-drain wiring line of the drive TFT 12. The routing wiring line is extended to the end of peripheral edge of the array substrate 50, and forms a terminal to connect the FPC 52 or the driver IC 48 shown in FIG. 2.

A planarization film 72 is formed above the drive TFT 12. As the planarization film 72, an organic material such as a photosensitive acrylic resin is used in many cases. The planarization film 72 has excellent surface flatness compared to an inorganic insulating material formed by a chemical vapor deposition (CVD) method or the like. The planarization film 72 is removed in a pixel contact section and a peripheral region. The upper surface of the second wiring line 70 exposed by the removal of the planarization film 72 is covered by a transparent conductive film 74 made of indium tin oxide (ITO).

Subsequently, a third wiring line 76 is provided in the same layer as the transparent conductive film 74. In the embodiment, the third wiring line 76 is provided to have a three-layer stacked structure of Mo, Al, and Mo, and is used to form a peripheral routing wiring line or a capacitive element additionally provided in a pixel. Covering the upper surface of the second wiring line 70 exposed after removing the planarization film 72 with the transparent conductive film 74, as mentioned above, also means to protect the exposed surface of the second wiring line 70 from a patterning step of the third wiring line 76. The transparent conductive film 74 and the upper surface of the third wiring line 76 are temporarily covered with a third silicon nitride film 78. Thereafter, in the pixel contact section of the transparent conductive film 74, an opening is provided in the third silicon nitride film 78, and a portion of the upper surface of the transparent conductive film 74 is exposed.

In the embodiment, layers from the layer in which the first wiring line 62 described above is present to the layer in which the third wiring line 76 is present are defined as a wiring layer 86.

Thereafter, a lower electrode 80 serving as a pixel electrode is formed so as to be connected to the upper surface of the transparent conductive film 74 exposed through the opening. In the embodiment, the lower electrode 80 is formed as a reflecting electrode, and has a three-layer stacked structure made of ITO, Ag, and ITO. In the pixel contact section, an additional capacitance is formed by the transparent conductive film 74, the third silicon nitride film 78, and the lower electrode 80. Incidentally, the transparent conductive film 74 is partially exposed to an etching environment during the patterning of the lower electrode 80; however, the transparent conductive film 74 has resistance to etching of the lower electrode 80 through an annealing treatment performed during the period from after a forming step of the transparent conductive film 74 to a forming step of the lower electrode 80.

After the forming step of the lower electrode 80, an insulating film 82 called a bank or a rib and serving as a partition wall of a pixel region is formed. As the insulating film 82, a photosensitive acrylic resin or the like is used in the same manner as for the planarization film 72. The insulating film 82 is opened so as to expose the upper surface of the lower electrode 80 as a light-emitting region, and the opening edge preferably has a smooth tapered shape. When the opening edge has a steep shape, a coverage defect of an organic layer 100 to be formed later occurs. Here, the planarization film 72 and the insulating film 82 includes a portion where the planarization film 72 and the insulating film 82 are in contact with each other through the opening provided in the third silicon nitride film 78 intervening therebetween. The opening is provided to extract, through the insulating film 82, the moisture or gas desorbed from the planarization film 72 through a heat treatment or the like after the forming step of the insulating film 82.

After the formation of the insulating film 82, organic materials constituting the organic layer 100 are stacked and formed. As a stacked structure constituting the organic layer 100, a hole transport layer 102, a light-emitting layer 104, and an electron transport layer 106 are stacked and formed in order from the lower electrode 80 side. In the embodiment, the hole transport layer 102 and the electron transport layer 106 are formed over a plurality of sub-pixels, and the light-emitting layer 104 is formed for each sub-pixel. The organic layer 100 may be formed by evaporation, or may be formed by application through dispersion with a solvent. Moreover, the organic layer 100 may be selectively formed for each sub-pixel, or may be formed in the form of a layer over the entire surface covering the display region 42. When the organic layer 100 is formed in the form of a layer, the display device can be configured such that white light is obtained in all sub-pixels and a desired color wavelength portion is extracted by a color filter (not shown). In the embodiment, a configuration is employed in which the organic layer 100 is selectively formed for each sub-pixel.

After the formation of the organic layer 100, an upper electrode 84 is formed. In the embodiment, a top-emission structure is employed, and therefore, the upper electrode 84 is formed using a transparent conductive material, indium zinc oxide (IZO) as one example. According to the order of formation of the organic layer 100 described above, the lower electrode 80 serves as an anode, and the upper electrode 84 serves as a cathode.

The upper electrode 84, the organic layer 100, and the lower electrode 80 constitute the organic light-emitting diode 6. In the embodiment, the display device 2 includes: a first organic light-emitting diode 6G including, in a first organic layer 100G, a first light-emitting layer 104G that emits green light; a second organic light-emitting diode 6R including, in a second organic layer 100R, a second light-emitting layer 104R that emits red light; and a third organic light-emitting diode 6B including, in a third organic layer 100B, a third light-emitting layer 104B that emits blue light.

The lower electrode 80 of the first organic light-emitting diode 6G is connected to the first drive TFT 12A. The lower electrode 80 of the second organic light-emitting diode 6R is connected to the second drive TFT 12B. The lower electrode 80 of the third organic light-emitting diode 6B is connected to the third drive TFT 12C.

After the formation of the upper electrode 84, a passivation layer 90 is formed. One of the functions of the passivation layer 90 is to prevent the entry of moisture from the outside into the organic layer 100 previously formed, and high gas-barrier properties are required of the passivation layer 90. In the embodiment, a stacked structure of a fourth silicon nitride film 92, an organic resin film 94 made of an acrylic resin or the like, and a fifth silicon nitride film 96 is employed as a stacked structure of the passivation layer 90. Further, the passivation layer 90 may be configured such that a silicon oxide film intervenes between the organic resin film 94 and the fifth silicon nitride film 96.

Figure 4:
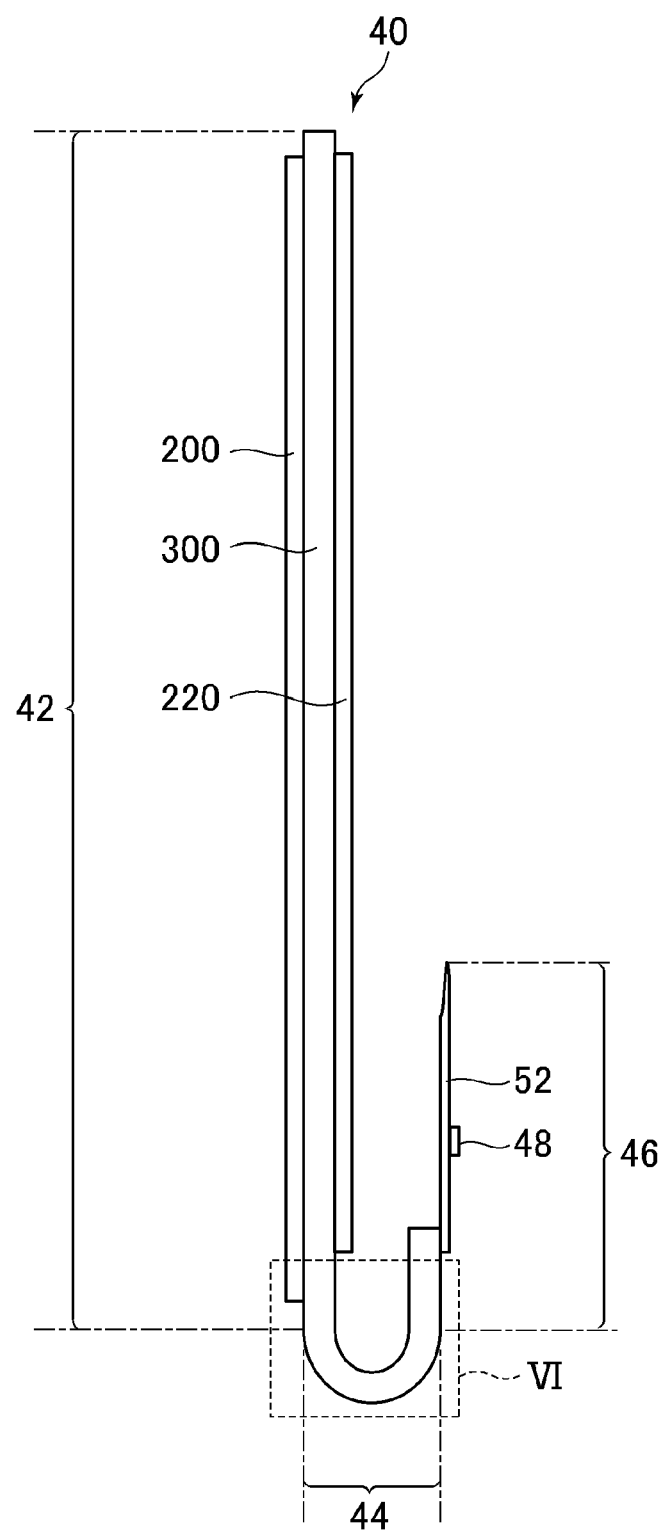
FIG. 4 is a schematic side view showing a folded back state of the display panel in the embodiment.

FIG. 4 is a schematic side view showing a folded back state of the display panel 40 in the embodiment. As shown in FIG. 4, when the display panel 40 is stored in a casing of the display device 2, the display panel 40 can be brought into the state where the drive section forming region 46 is folded back to the rear side of the display region 42 with a curved region 44 provided outside the display region 42 of the display panel 40. That is, the display panel 40 can be brought into the state where the rear surface of the display region 42 and the rear surface of the drive section forming region 46 face each other.

Figure 6:
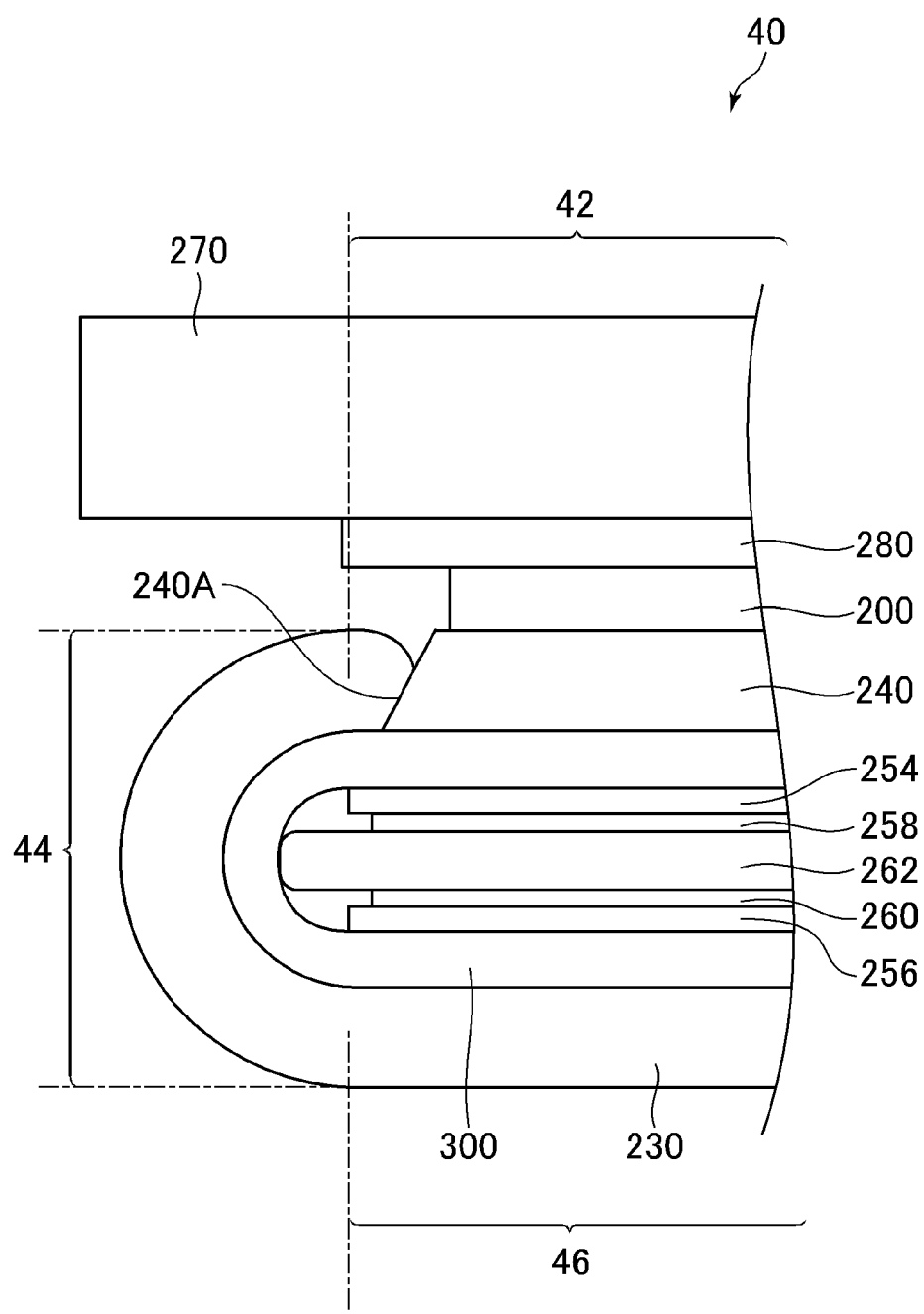
FIG. 6 is an enlarged side view of the portion VI shown in FIG. 4.

FIG. 6 is an enlarged side view of the portion VI shown in FIG. 4. As shown in FIG. 6, the display panel 40 includes, in addition to the organic light-emitting diode structure layer 300 and the polarizer 200 described above, a resin layer 230, an optical film 240, a first lamination film 254, a second lamination film 256, a cushion sheet 258, an adhesive layer 260, a spacer 262, a cover glass 270, and an optical transparent double-sided sheet 280.

The optical transparent double-sided sheet 280 is made of an acrylic-based, silicon-based, or urethane-based resin, and bonds the cover glass 270 and the polarizer 200 together.

As shown in FIG. 6, the resin layer 230 is provided from the drive section forming region 46 to the curved region 44 of the display panel 40. The resin layer 230 includes, for example, a curable resin composition such as an acrylic resin or an epoxy resin. As a forming method of the resin layer 230, any proper method can be employed, and, for example, the resin layer 230 is applied to the front surface side of the organic light-emitting diode structure layer 300 by an inkjet method. When an inkjet method is employed, for example, the viscosity of a resin is set to be low for stably discharging the resin through a nozzle.

Here, the thickness of the resin layer 230 is controlled such that the wiring layer 86 shown with reference to FIG. 5 is disposed in a neutral plane in the curved region 44. That is, in the curved region 44, a tensile stress occurs on the front surface side (outer surface side) in the configuration including the resin layer 230 and the organic light-emitting diode structure layer 300, and a compressive stress occurs on the rear surface side (inner surface side). However, a neutral plane where the tensile stress and the compressive stress are canceled out is present between the front surface side and the rear surface side. By disposing the wiring layer 86 in the neutral plane, it is possible to reduce the risk of deformation or breakage of the first wiring line 62, the second wiring line 70, the third wiring line 76, and the like included in the wiring layer 86.

Figure 7:
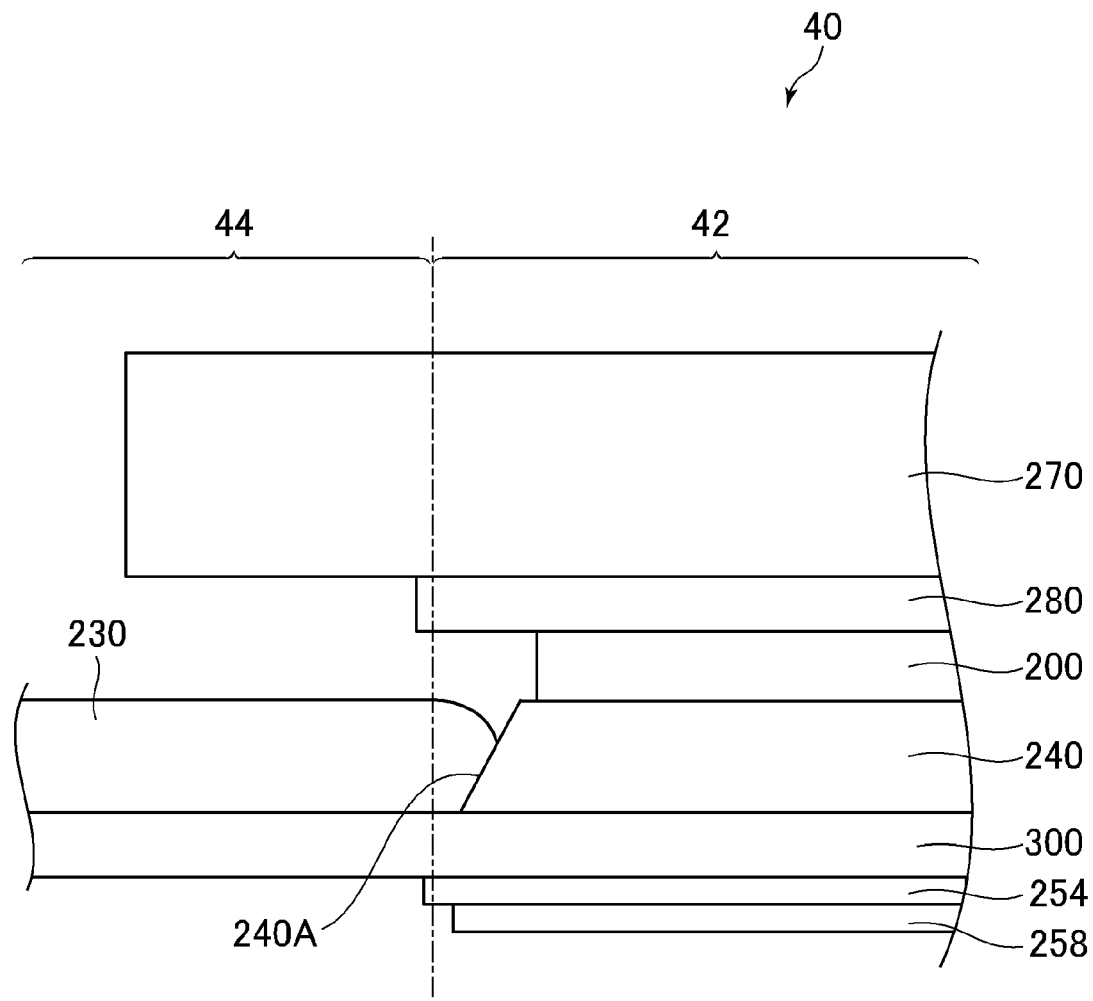
FIG. 7 is an enlarged side view of the portion VII shown in FIG. 3.

FIG. 7 is an enlarged side view of the portion VII shown in FIG. 3. As shown in FIGS. 6 and 7, the optical film 240 is disposed in the display region 42 of the display panel 40. The optical film 240 is made of a material whose influence on the phase of light emitted from the organic light-emitting diode 6 included in the organic light-emitting diode structure layer 300 is smaller than that of the resin layer 230, and is made of, for example, a cycloolefin-based resin material.

Here, the optical film 240 is configured to include an inclined surface 240A at an end face on the curved region 44 side. That is, the thickness of the optical film 240 is configured to be reduced with decreasing distance from the display region side toward the curved region side in the forming region of the inclined surface 240A. In the embodiment, the end of the resin layer 230 described above is configured to be disposed at some midpoint of the inclined surface 240A.

In this manner, the optical film 240 made of the material having a small phase difference plays the role of a dam that dams up the resin layer 230, and suppresses the entry of the resin layer 230 into the display region 42. Further, by employing a configuration in which the optical film 240 includes the inclined surface 240A at an end face on the curved region 44 side and the end of the resin layer 230 is disposed at some midpoint of the inclined surface 240A, the occurrence risk of disconnection of the wiring lines included in the display panel 40 can be reduced. The reasons will be described below.

Figure 8:
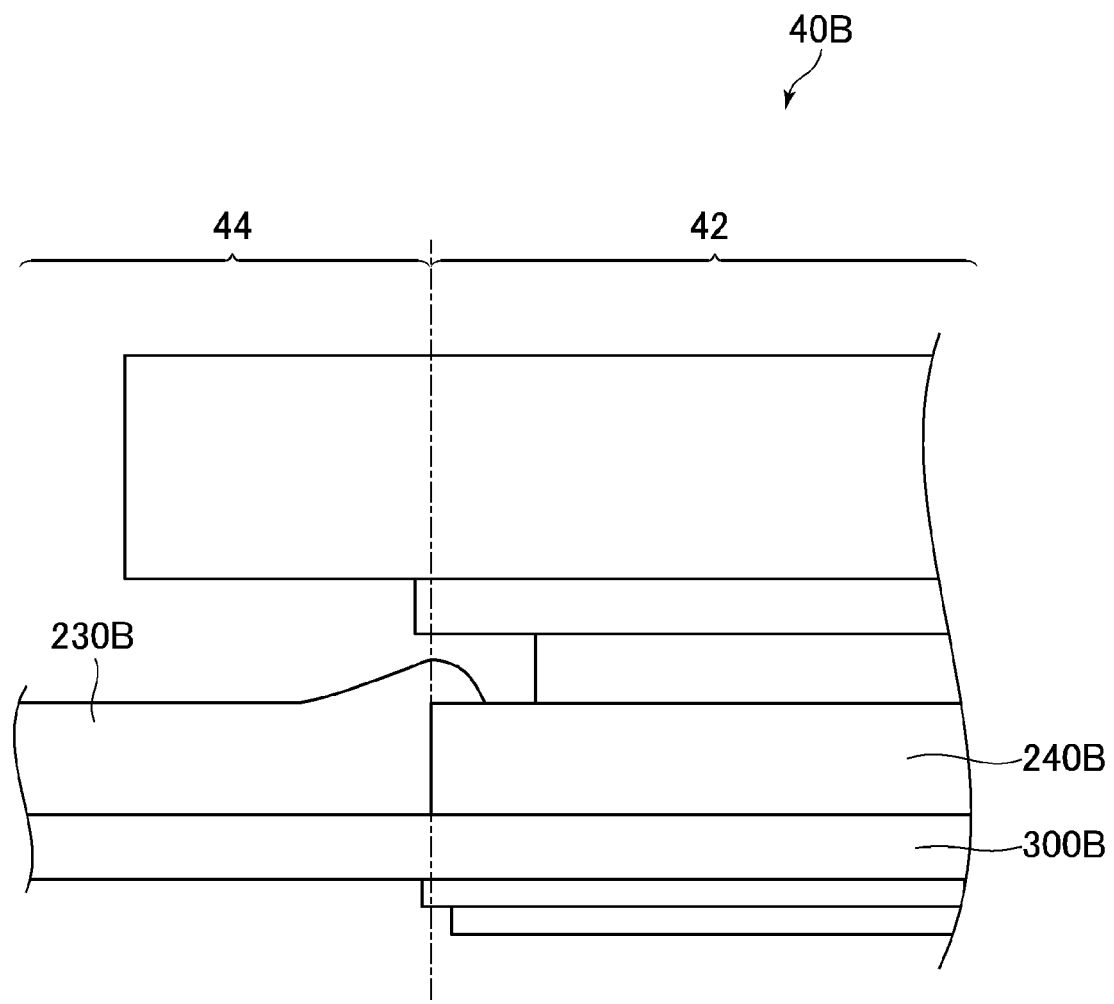
FIG. 8 is a schematic enlarged side view of a display device according to a comparative example.

FIG. 8 is a schematic enlarged side view of a display device 40B according to a comparative example. As shown in FIG. 8, when an optical film 240B does not include the inclined surface described above, a resin layer 230B may protrude and ride up over the upper surface of the optical film 240B due to a surface tension. In such a case, the tensile stress is shifted outward depending on the thickness of the resin layer 230B riding up over the upper surface of the optical film 240B. As a result, the control of a neutral plane for a wiring layer included in an organic light-emitting diode structure layer 300B is not proper, which involves the risk that the compressive stress is applied to the wiring layer. In contrast, in the embodiment, the optical film 240 includes the inclined surface 240A as shown in FIGS. 6 and 7, and the smaller the contact angle of the inclined surface 240A with respect to the surface of the organic light-emitting diode structure layer 300 is, the more the direction of the protrusion of the resin layer 230 due to the surface tension can be extended in the lateral direction. Therefore, changes in the thicknesses of the resin layer 230 and the optical film 240 provided on the front surface side of the organic light-emitting diode structure layer 300 can be reduced. As a result, the control of the neutral plane for the wiring layer 86 can be properly performed, and thus the occurrence risk of disconnection of the wiring lines in the wiring layer 86 can be reduced.

The first lamination film 254 disposed on the rear surface side of the display region 42 of the display panel 40 and the second lamination film 256 disposed on the rear surface side of the drive section forming region 46 protect and reinforce the organic light-emitting diode structure layer 300. The first lamination film 254 and the second lamination film 256 are attached to the rear surface side of the organic light-emitting diode structure layer 300 with an adhesive member or the like. The adhesive member to be used may be an adhesive member made of a resin or the like having adhesion, or may be a double-sided tape or the like.

The spacer 262 disposed between the first lamination film 254 and the second lamination film 256 guides the curvatures of the resin layer 230 and the organic light-emitting diode structure layer 300. A cross-section of the spacer 262 that is in contact with the organic light-emitting diode structure layer 300 has a curved shape in a side view. The end face of the spacer 262 has the curved shape described above, and therefore, the disconnection or breakage of the wiring lines is less likely to occur in the curved region 44 of the display panel 40.

The cushion sheet 258 disposed between the first lamination film 254 and the spacer 262 reduces shock in a direction vertical to the formation plane of the spacer 262.

The adhesive layer 260 disposed between the spacer 262 and the second lamination film 256 brings the spacer 262 and the second lamination film 256 into intimate contact with each other and integrate the spacer 262 and the second lamination film 256 as the display panel 40.

Those skilled in the art should be able to arrive at various kinds of variations and modifications within the spirit of the present invention, ant it is understood that such variations and modifications are within the scope of the present invention. For example, addition, deletion, or design change of components, or by addition, omission, or condition change of processes made by those skilled in the art as appropriate in each embodiment as described above are also encompassed within the scope of the present invention as long as they fall within the spirit of the present invention.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
    a display panel including a display region, a drive section forming region, and a curved region, the display region including a pixel array section, the drive section forming region including a drive section driving the pixel array section, the curved region coupling the display region to the drive section forming region,
    the display panel including
        an organic light-emitting diode structure layer including an organic light-emitting diode,
        an optical film provided on a front surface side of the organic light-emitting diode structure layer in the display region and including an inclined surface at an end face on the curved region side in a sectional view, and
        a resin layer provided on the front surface side of the organic light-emitting diode structure layer in at least the curved region and provided so as to be in contact with the inclined surface, wherein
    the curved region is curved, so that a rear surface side of the display region and a rear surface side of the drive section forming region face each other; and
    a thickness of the inclined surface of the optical film is shorter than a thickness of the display region of the optical film.

2. The display device according to claim 1, wherein
in a forming region of the inclined surface, the thickness of the optical film is reduced with decreasing distance from the display region side toward the curved region side.

3. The display device according to claim 1, wherein
an end of the resin layer is disposed at some midpoint of the inclined surface.

4. The display device according to claim 2, wherein
the organic light-emitting diode structure layer includes a wiring layer, and
in the curved region, the wiring layer is disposed in a neutral plane where a tensile stress and a compressive stress that occur in a configuration including the resin layer and the organic light-emitting diode structure layer are canceled out.

5. The display device according to claim 1, wherein
the resin layer includes a curable resin composition.

6. The display device according to claim 1, wherein
the optical film is made of a material whose influence on the phase of light emitted from the organic light-emitting diode is smaller than that of the resin layer.

7. The display device according to claim 6, wherein
the optical film includes a cycloolefin-based resin material.

* * * * *